US009568507B2

(12) United States Patent
Perry et al.

(10) Patent No.: US 9,568,507 B2
(45) Date of Patent: Feb. 14, 2017

(54) WIRELESS VOLTAGE REFERENCE BROADCAST IN A DISTRIBUTED ENERGY METERING SYSTEM

(75) Inventors: David Gareth Perry, Spencerville (CA); Emil T. Joannou, Almonte (CA); Denis A. Gallant, Ottawa (CA)

(73) Assignee: ENERCARE CONNECTIONS INC., Toronto, Ontario (CA)

( * ) Notice: Subject to any disclaimer, the term of this patent is extended or adjusted under 35 U.S.C. 154(b) by 465 days.

(21) Appl. No.: 13/994,626

(22) PCT Filed: Dec. 14, 2011

(86) PCT No.: PCT/CA2011/001359
§ 371 (c)(1),
(2), (4) Date: Oct. 21, 2013

(87) PCT Pub. No.: WO2012/079151
PCT Pub. Date: Jun. 21, 2012

(65) Prior Publication Data
US 2014/0028282 A1 Jan. 30, 2014

Related U.S. Application Data

(60) Provisional application No. 61/423,233, filed on Dec. 15, 2010.

(51) Int. Cl.
G01R 19/00 (2006.01)
G01R 21/133 (2006.01)

(52) U.S. Cl.
CPC ......... *G01R 19/0092* (2013.01); *G01R 21/133* (2013.01)

(58) Field of Classification Search
CPC .................................................. G01R 19/0092
(Continued)

(56) References Cited

U.S. PATENT DOCUMENTS 6,825,776 B2 * 11/2004 Lightbody et al. ...... 340/870.02
7,747,733 B2 * 6/2010 Kagan ........................... 709/224
(Continued)

FOREIGN PATENT DOCUMENTS

CN              2535868 Y  *  2/2003  ............ G08C 17/02
WO     2007062232 A2     5/2007

OTHER PUBLICATIONS

English translation of CN2535868Y [shown above].*
(Continued)

*Primary Examiner* — Jermele M Hollington
*Assistant Examiner* — Zannatul Ferdous
(74) *Attorney, Agent, or Firm* — Garvey, Smith, Nehrbass & North LLC; Brett A. North

(57) ABSTRACT

A system and method of wireless voltage reference broadcast in a distributed energy metering system is provided. A voltage reference is determined at a distribution hub for wirelessly and transmitted in voltage reference data frames providing voltage samples and a clock synchronization from an alternating current (AC) line under measurement. Wireless metering units, each coupled to an AC load circuit, receive the voltage reference data frames wherein the current sampling clock of the wireless metering units are synchronized to a voltage sampling clock of the distribution hub for determining current samples from the respective AC load circuit to calculate energy data parameters.

22 Claims, 11 Drawing Sheets

(58) Field of Classification Search
USPC .................................................... 324/76.11
See application file for complete search history.

(56) References Cited

U.S. PATENT DOCUMENTS

| | | |
|---|---|---|
| 2003/0014200 A1* | 1/2003 | Jonker et al. .................. 702/60 |
| 2003/0014678 A1* | 1/2003 | Ozcetin et al. ............... 713/400 |
| 2010/0134089 A1* | 6/2010 | Uram .................. G01R 22/063 |
| | | 324/66 |
| 2011/0208364 A1 | 8/2011 | Deloach, Jr. |

OTHER PUBLICATIONS

Huayun et al., "The All-digital Electrical Energy Metering System Based on Optical Current and Voltage Transducer", Asia-Pacific Power and Energy Engineering Conference (APPEEC), Mar. 28-31, 2010, p. 1-4.

McGhee et al., "Smart High Voltage Substation based on IEC 61850 Process Bus and IEEE 1588 Time Synchronization", First IEEE International Conference on Smart Grid Communications (SmartGridComm), Oct. 4-6, 2010, p. 489-494.

Moore et al., "Practical Experience with IEEE 1588 High Precision Time Synchronization in Electrical Substation based on IEC 61850 Process Bus", IEEE Power and Energy Society General Meeting, Jul. 25-29, 2010, p. 1-4.

Zheng et al., "Design and Implementation of Remote Meter Reading System", 2nd International Conference on Software Technology and Engineering (ICSTE), Oct. 3-5, 2010, p. V2-247-V2-250.

* cited by examiner

WIRELESS VOLTAGE REFERENCE BROADCAST IN A DISTRIBUTED ENERGY METERING SYSTEM

TECHNICAL FIELD

The present disclosure relates to wireless energy meters for residential, commercial, and industrial electrical power circuits and in particular to the wireless method of accurately distributing the voltage references for generating revenue-grade industrial active, reactive and apparent power measurements.

BACKGROUND

Standard industrial (20 Amps and above) electrical power/energy meters are often based on current transformers (CT's) for real-time current sensing. An industrial power meter will typically have a CT per load circuit under measurement (e.g. a 3-phase circuit requires three CT's). Load circuits under measurements are inductively applied as the primary side of the CT via the CT's core aperture and the CT's secondary core winding is directly wired to the industrial power meter via a pair of metallic wires. Additionally, an industrial meter will have one potential transformer (PT) per voltage phase being measured. Typically, an industrial facility is a 3-phase electrical environment and therefore three PTs are attached to the industrial power meter to provide associated voltage references for power/energy calculations. The industrial power meter's processing unit calculates active, reactive, and apparent power demand (kW), energy consumption (kW-h), and power factors from the wired CTs (real-time current) and the associated PTs (real-time voltage).

In typical industrial environment, the direct wiring of CTs to the energy meter is problematic and labour intensive. In the electrical facility room, the load circuits to be measured are typically only accessible inside the electrical panelboards, and therefore the CTs have to be installed inside the panelboard. The centralized energy meter is generally installed in the electrical facility room adjacent (i.e. external) to the circuit panelboard. For a large number of CTs, the wiring of CTs from inside the panelboard (via conduits and punch-outs) to an external meter is labour intensive, time consuming, and error prone. The potential exposure of the CT wires, crimps, and screw blocks is also a safety concern in some installations.

The present disclosure of a wireless voltage reference distribution method leads to the design of an industrial CT metering system that eliminates the requirement for any CT panelboard wiring. The elimination of CT panelboard wiring greatly reduces meter installation cost and time. Also, the elimination of CT panelboard wiring greatly reduces the electrical safety concerns of an industrial CT metering installation.

SUMMARY

In accordance with an aspect of the present disclosure there is provided a method of wireless distributed energy metering, the method comprising determining a voltage reference sampling clock at a distribution hub; generating one or more digitized voltage samples from an alternating current (AC) line under measurement coupled to the AC line by a voltage sensing device; encoding a voltage reference frame comprising the one or more digitized voltage samples; and broadcasting the voltage reference data frame wirelessly to one or more wireless metering units each coupled to an AC load circuit of the AC line where a current sample clock of each of the wireless energy metering units is synchronized to the distribution hub voltage reference sampling clock and the one or more voltage samples and one or more current samples are utilized in calculating energy parameters sampled by the wireless energy metering units from the respective AC load circuit.

In accordance with another aspect of the present disclosure there is provided a method of wireless distributed energy metering in a wireless metering unit, the method comprising receiving a voltage reference data frame through a wireless interface; decoding one or more voltage samples from the voltage reference data frame; synchronizing a current sampling clock of the wireless metering unit based upon the voltage reference data frame; determining a current sample from a current sensing device coupled to an alternating current (AC) load circuit of the AC line, wherein the current sampling clock of the wireless energy metering unit is synchronized to a voltage sampling clock of a distribution hub.

In accordance with yet another aspect of the present disclosure there is provided a wireless metering distribution hub comprising a voltage sensing device coupled to an alternating current (AC) line under measurement; a wireless interface; and a processor for determining a voltage reference sampling clock; generating one or more digitized voltage samples from the AC line under measurement coupled to the AC line by the voltage sensing device; encoding a voltage reference data frame comprising the one or more digitized voltage samples and synchronization identifier determined from the voltage reference sampling clock; and broadcasting from the wireless interface the voltage reference data frame wirelessly to one or more wireless metering units.

In accordance with yet another aspect of the present disclosure there is provided a wireless energy metering unit comprising a current sensing device coupled to a load circuit of an alternating current (AC) line under measurement; a wireless interface; and a processor for receiving a voltage reference data frame through the wireless interface; decoding one or more voltage samples from the voltage reference data frame; synchronizing a current sampling clock of the wireless metering unit based upon the voltage reference data frame; and determining a current sample from the current sensing device, wherein a current sampling clock of the wireless energy metering unit is synchronized to voltage sampling clock of a distribution hub.

In accordance with still yet another aspect of the present disclosure there is provided a system for wireless distributed energy metering comprising a distribution hub for wirelessly transmitting voltage reference data frames providing voltage samples and a clock synchronization from an alternating current (AC) line under measurement; and one or more wireless metering units each coupled to an AC load circuit for receiving the voltage reference data frames wherein the current sampling clock of each of the one or more wireless metering units is synchronized to a voltage sampling clock of the distribution hub for determining current samples from the respective AC load circuit to calculate energy data parameters.

BRIEF DESCRIPTION OF THE DRAWINGS

Further features and advantages of the present disclosure will become apparent from the following detailed description, taken in combination with the appended drawings, in which.

DETAILED DESCRIPTION

Figure 1:
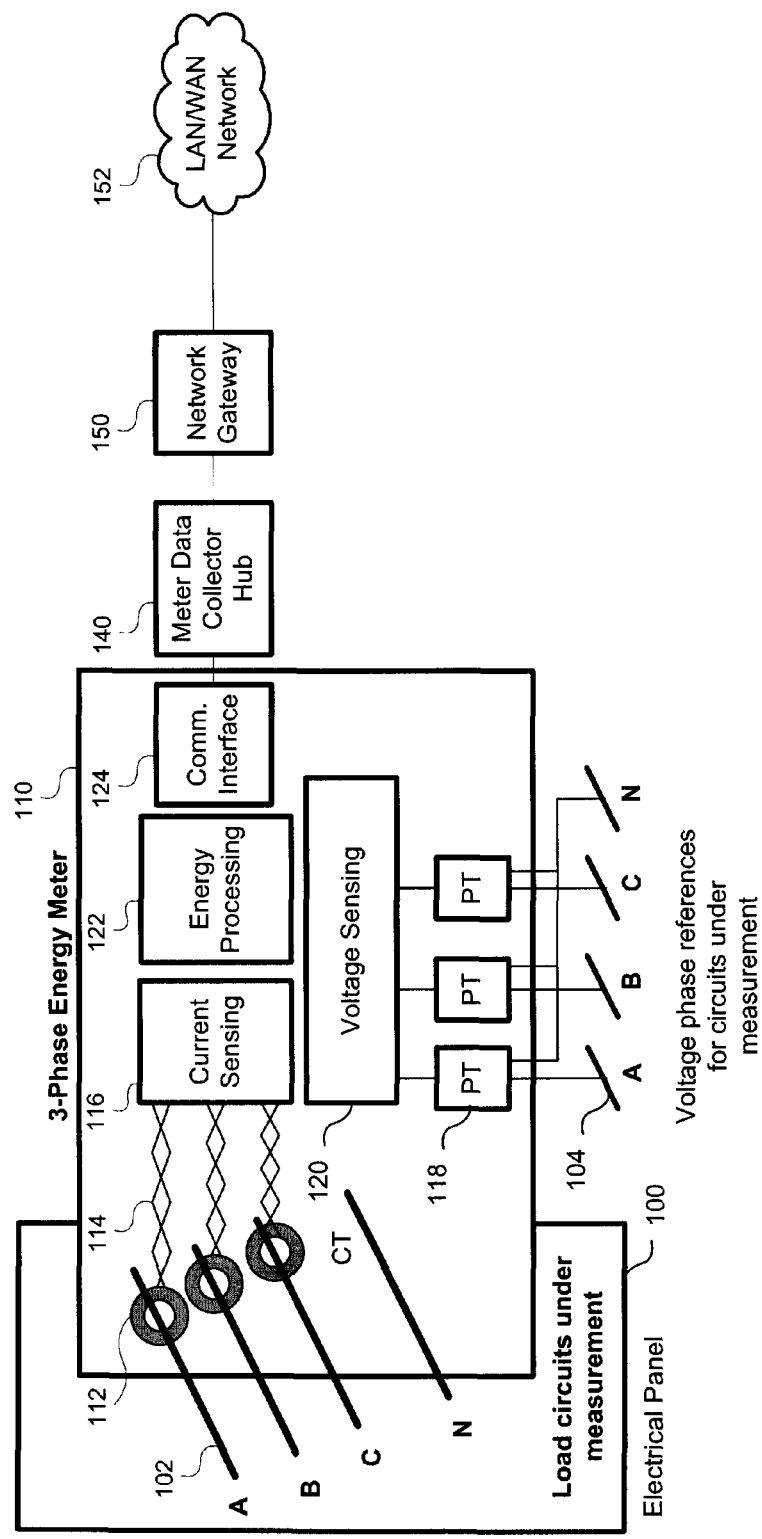
FIG. 1 shows a block diagram of a typical industrial energy meter system with metallic wired attached CTs.

Embodiments are described below, by way of example only, with reference to FIGS. 1-11.

Although the following discloses example methods, system and apparatus including, among other components, software executed on hardware, it should be noted that such methods, system and apparatus are merely illustrative and should not be considered as limiting. For example, it is contemplated that any or all of these hardware and software components could be embodied exclusively in hardware, exclusively in software, exclusively in firmware, or in any combination of hardware, software, and/or firmware. Accordingly, while the following describes example methods and apparatus, persons having ordinary skill in the art will readily appreciate that the examples provided are not the only way to implement such methods, system and apparatus.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

FIG. 1 shows a standard 3-phase industrial energy meter 110 with locally wired current 112 and potential 118 transformers for sensing load currents 102 and associated voltage references 104 respectively. A traditional industrial meter 110 as shown in FIG. 1 is typically installed external to the electrical panel 100 in order to accommodate the electrical wiring code regulations. The standard configuration of FIG. 1 requires interconnecting the in-panel CTs 112 to the external energy meter 110 via twisted wire pairs 114 that pass through the side walls of the electrical panel 100 via punch-outs and conduits. Power demand and energy consumption parameters are calculated by the centralized energy processor unit 122 from local current sensing 116 and voltage sensing 120 data. The standard industrial CT energy meter 110 communicates its meter reading data to a remote metering data collector hub 140 via wired or wireless in-building communications interface 124. The metering data collector hub 140 is typically interconnected to back-office automated metering systems (AMR) via standard network interfaces, gateways 150, and LAN/WAN networks 152.

Figure 2:
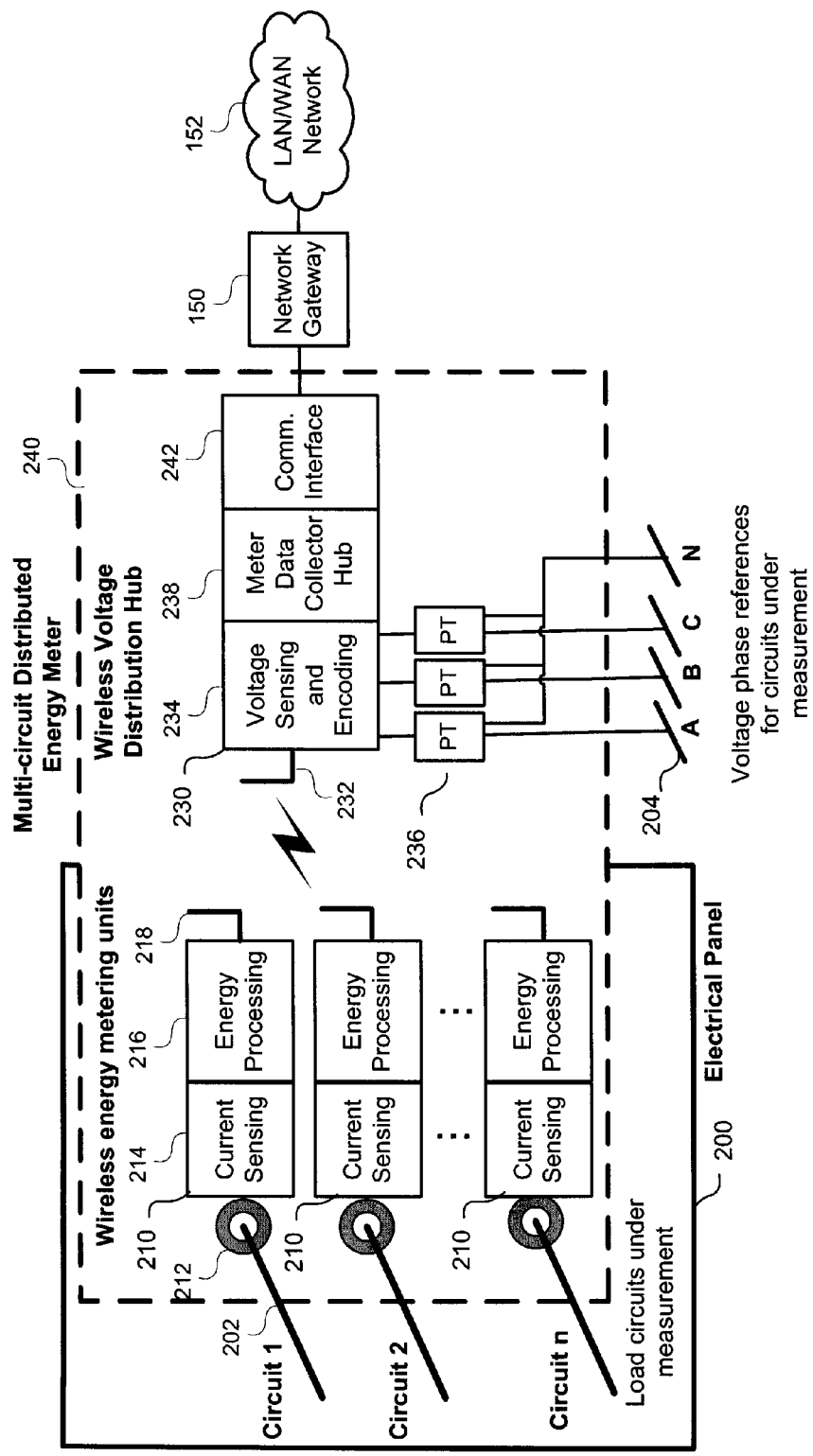
FIG. 2 shows a system block diagram of an industrial distributed energy metering system with wireless attached CTs.

FIG. 2 shows a system block diagram of wireless broadcast voltage reference distribution in a multi-circuit industrial wireless energy metering system. The voltage phase references 204 and potential transformers 236 of the multi-circuit distributed energy metering system 240 are physically associated with the centralized wireless voltage distribution hub 230. The voltage phase references 204 at wireless voltage distribution hub 230 are sensed 234 via the voltage sensing device such as PTs 236, then digitized at a high sampling rate in sync with the AC cycle under measurement (e.g. 60 Hz). The digitized voltage samples are then encoded 234 and transmitted by broadcasting through a wireless interface 232 of the wireless voltage distribution hub 230 via a radio frequency (RF) technology and received by the wireless metering units 210 wireless interfaces 218, such as a wireless transceiver and antenna module. The wireless energy metering system disclosed removes the requirement for cabling between the current sensing device and the energy meter enabling installation flexibility while maintaining metering performance. The RF technology may utilized licensed or unlicensed radio frequency spectrum using proprietary, or standardized communication technologies such as but not limited to Bluetooth, Bluetooth low energy, Wi-Fi IEEE 802.11, IEEE 802.15, ultra wide band (UWB), ONE-NET, Wireless USB, 6LoWPAN, and Zigbee technologies. The plurality of wireless metering units 210 in the electrical panel 200 calculate power demand and energy consumption parameters 216 from the current sensing device 212 sensed current through circuit 202 and associated wireless remote voltage phase reference received from the distribution hub. The current sensors can be any sensor capable of determining a current value such as a current transformer (CT), Rogowski coil, shunt, hall effect sensor; and Micro-Electro-Mechanical Systems (MEM) based sensor. The determined power/energy consumption parameters are transferred to data hub module 238 of the wireless voltage distribution node 230 via an RF interface. The wireless voltage distribution hub node 230 is typically interconnected to back-office automated metering systems (AMR) via standard network interfaces 242, gateways 150, and LAN/WAN networks 152.

Figure 3:
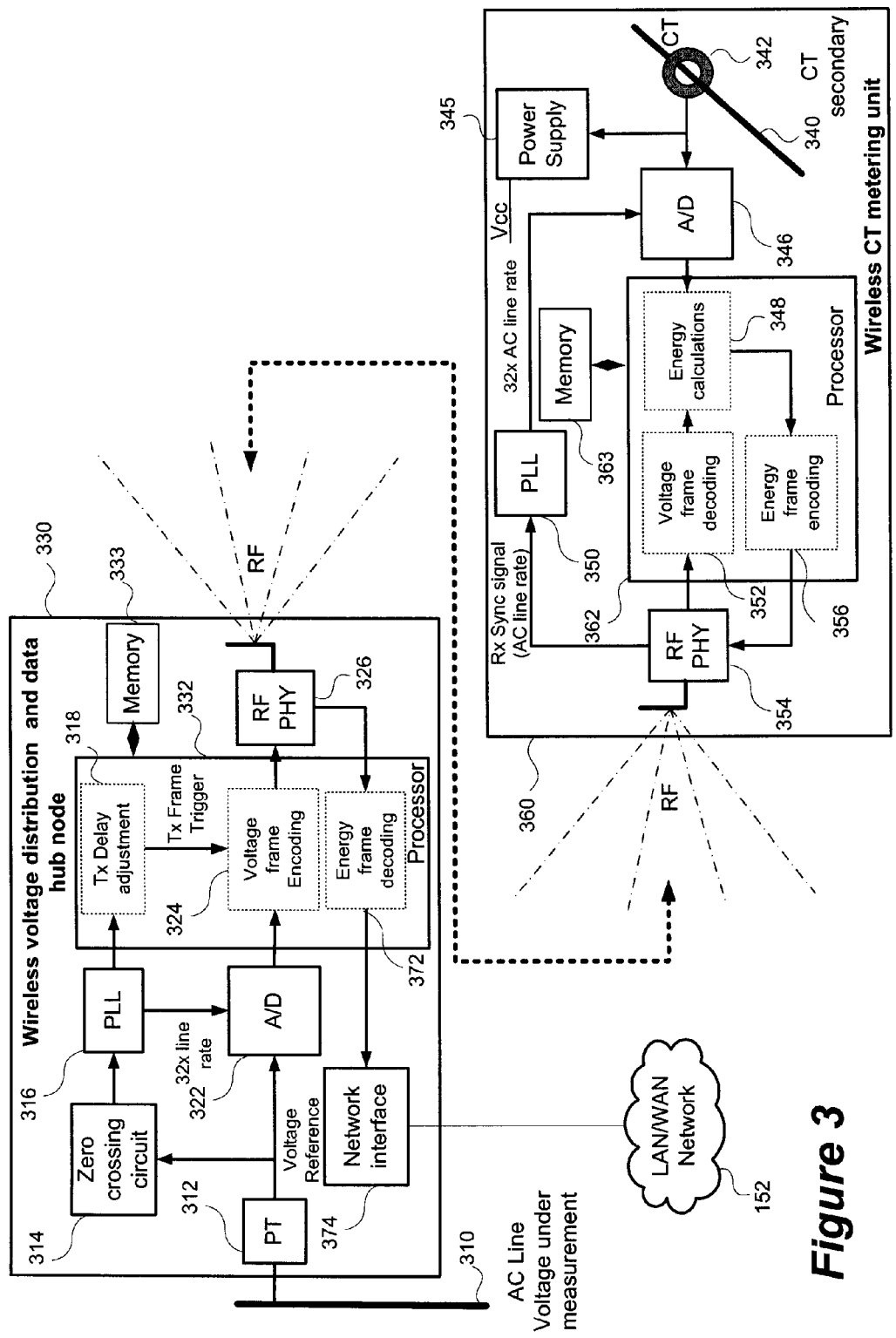
FIG. 3 shows a system block diagram for a wireless voltage reference broadcast node in a single phase distributed energy measurement meter.

FIG. 3 shows the block diagram of a wireless voltage reference distribution sub-system in a single-phase energy measurement system. A wireless voltage reference broadcast node 330 receives the AC voltage from an AC line 310 under measurement via a step-down PT 312. The voltage reference determined by voltage sensing device, PT 312, is applied to both zero-crossing detection circuit 314 and A/D converter 322. The zero-crossing circuit 314 supplies the phase-lock-loop (PLL) 316 with a trigger signal on each zero crossing of the AC voltage input signal 310. Based on the zero-crossing trigger signal, the PLL 316 generates a synchronized 32 times sampling clock for the A/D converter 322 for the digitization of the AC input reference voltage. The PLL's 316, 32 times sampling clock signal is also applied to a transmission delay adjustment function 318 to provide transmission delay compensation for the wireless interface provided by the RF physical layer (PHY) transceiver chip 326. A processor 332 provides data processing and payload processing functionality. A transmission delay adjustment function (Tp) 318 generates an advanced transmit frame synchronization (sync) signal to trigger the RF broadcast transmission of voltage reference data frames the are encoded by voltage reference data frame encoding function 324. The trigger occurs slightly ahead in time to the voltage reference sampling clock. One or more active wireless energy metering units 360 operating on the designated RF channel receive the transmitted broadcast voltage reference data frame via RF PHY transceiver module 354 wireless interface. The received voltage reference data frame is decoded by processor 362 in voltage reference data frame decoding function 352 and the remote voltage reference samples are stored in memory 363 for power and energy parameter calculations function 348. The wireless energy metering unit's 360 received RF PHY circuitry 354 or processor 362 generates an Rx sync signal that is in synchronization and alignment with the received voltage reference data frames. The voltage reference Rx sync signal is applied to the wireless energy metering unit's PLL 350. Aligned by the Rx sync signal, the PLL 350 will generate a synchronized 32 times clock for use in sampling and digitizing by analog to digital converter 346 of the sense current 340 under measurement by a current sensing device, CT 342. The digitized current samples are transferred to the processor 348 for revenue-grade active, reactive, and apparent energy calculations based on the stored in memory 363 temporally aligned remote voltage reference samples.

In a fully self-contained wireless metering unit, the wireless metering unit can inductively harvest operating power from the line circuit under measurement via the CT's secondary winding 342. The power supply 345 extracts a charging current from the electrical conductor circuit under measurement via inductive means through a common secondary current sensing winding of the CT 342. Alternatively, the power supply 345 may be provided as a battery that may either be chargeable by the charging current or operate independently of the CT operation for providing power to components of the wireless metering unit.

In FIG. 3, the calculated energy readings from the processor 348 are assembled by energy frame encoding 356 into a Tx energy readings frame ready for transmission upon a polling request message contained within the Rx voltage frame. When the wireless energy metering unit 360 receives an energy readings polling request from the hub node 330 via the voltage reference data frame, it will transmit the assembled Tx energy readings frame to the hub node 330 via the RF PHY 354 and wireless interface. The Rx energy readings frame received from a wireless energy metering unit 360 via the RF interface and are decoded by processor 372 and the energy readings are stored in the hub node's energy data storage memory 333 in a suitable format for network transfer and viewing. The energy data can be transferred or viewed by remote network devices via the hub node's network interface 374.

In FIG. 3 some functions of the wireless voltage distribution data hub node 330 and the wireless energy metering units 360 are shown as discrete functional blocks or processor implemented functions, however all aspect of the wireless voltage distribution data hub node 330 and the wireless energy metering units 360, except CT and PT can be implemented on an integrated processor or SOC (System-on-a-Chip). An integrated MCU (SOC) may provide MCU, RF, A/D, PLL, timers, memory, and network interface all integrated in a single integrated circuit (IC). Alternatively discrete components or a combination of discrete components and processor implemented functions may be utilized to implement one or more functions of the wireless distribution data hub node 330 or wireless energy metering units 360.

Figure 4:
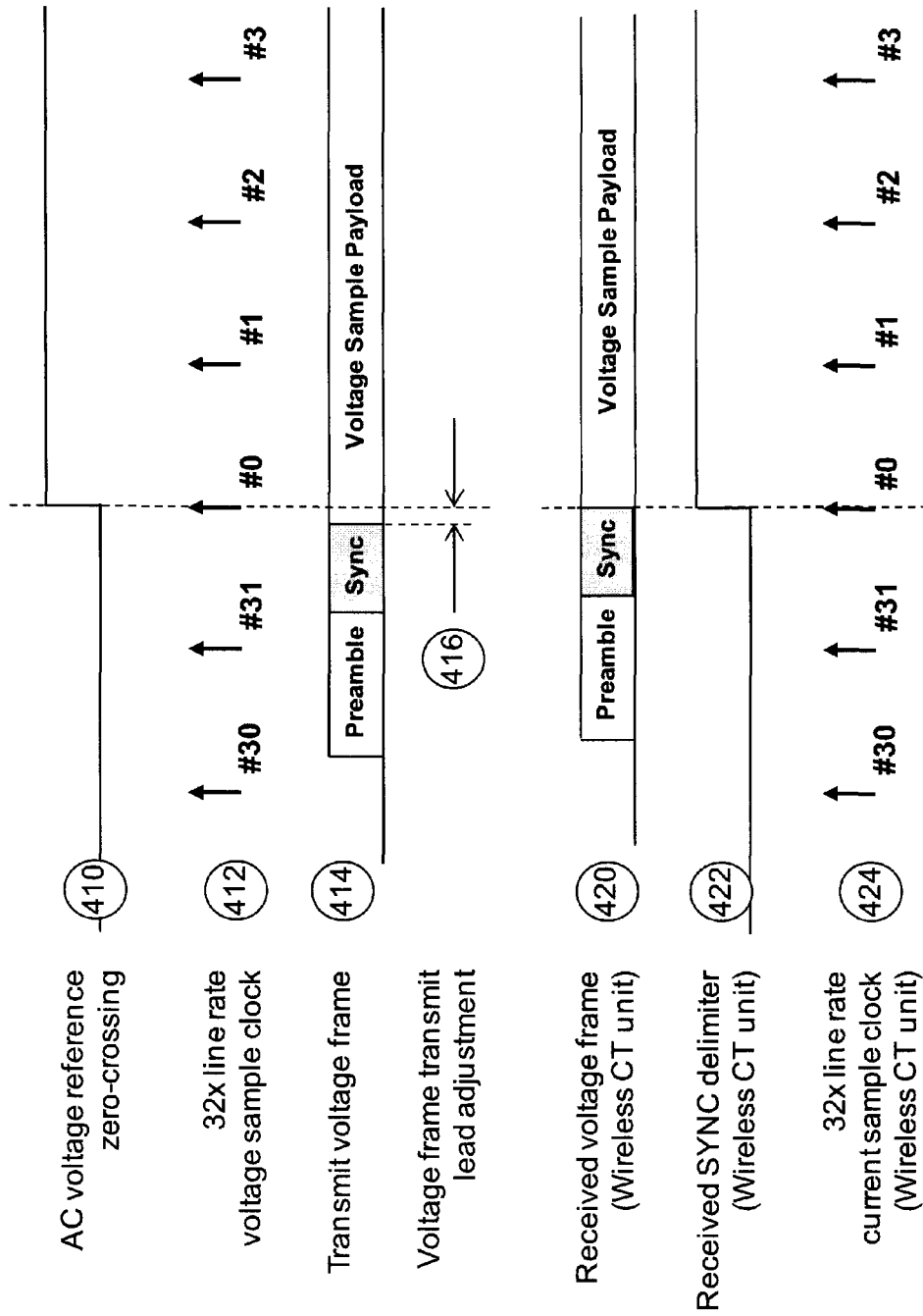
FIG. 4 shows a timing diagram of the voltage and current sampling alignment in a wireless broadcast voltage reference distribution metering sub-system.

FIG. 4 shows a timing diagram of the alignment of the wireless energy meter current samples with the remote voltage reference samples. At the voltage reference distribution node 330, a zero-crossing signal 410 is generated from the AC line signal 310. From the zero-crossing signal 410, a high-rate synchronized signal 412 is generated for sampling the voltage reference at 32 times the AC line rate. For every AC line cycle, 32 voltage reference samples from the previous cycle are assembled into a RF frame 414 for RF broadcast 332. The timing of the transmit voltage reference data frame is advanced by a small amount 416 to account for fixed transceiver delays. At the wireless energy metering unit 360, the SYNC byte delimiter of the received voltage reference data frame 420 is used to generate a received sync signal 422 and a synchronized 32 times line rate current sampling signal 424 that is aligned with the voltage reference sampling signal 412 of the transmit voltage reference node 330.

Figure 5:
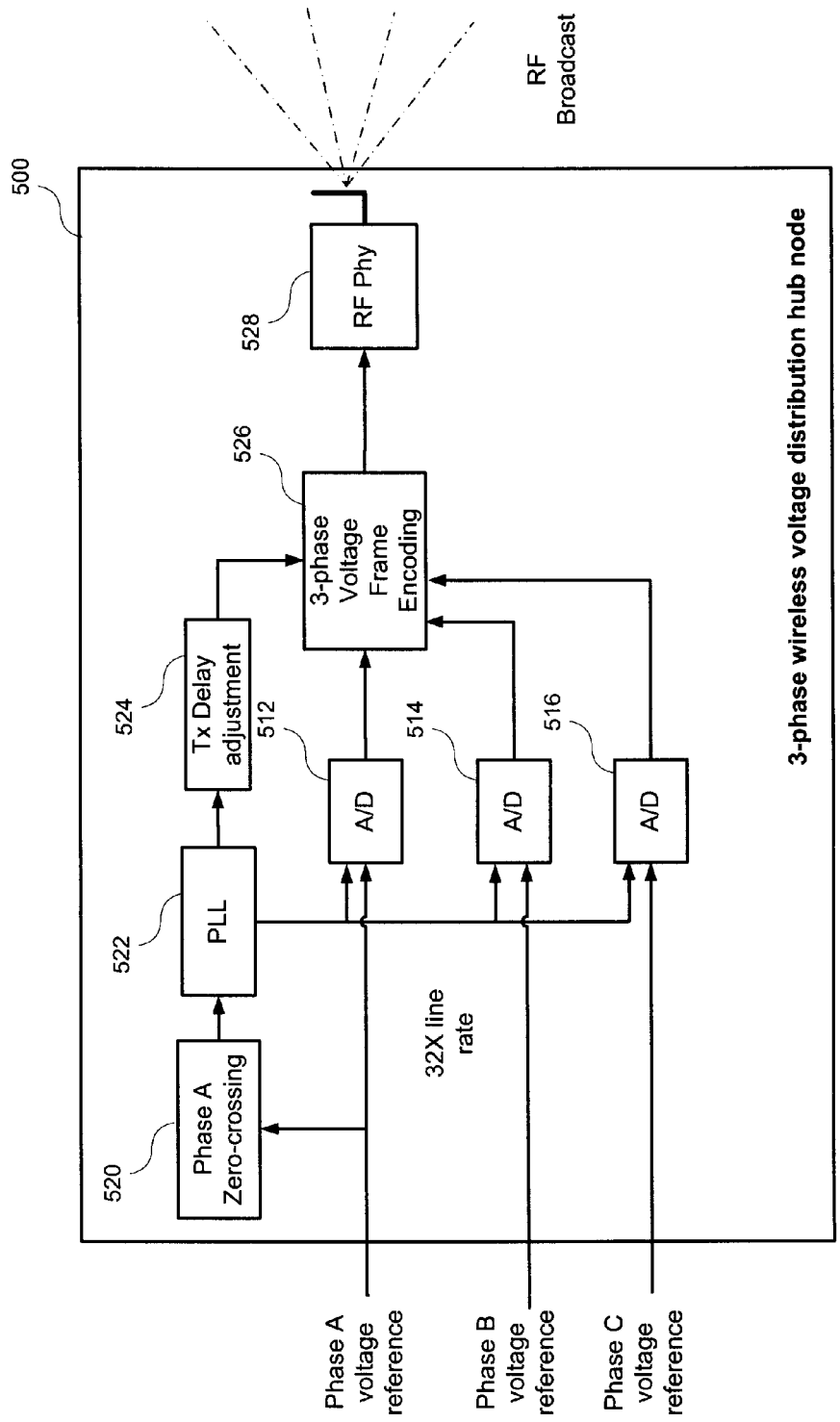
FIG. 5 a system block diagram for a wireless voltage reference broadcast node for a multi-phase distributed energy measurement meter.

FIG. 5 show a system block diagram of a multi-phase distributed metering system. In this simplified block diagram only transmission functions are shown as the reception process of energy readings would be similar to FIG. 3. A multi-phase distributed metering system includes a multi-phase wireless voltage distribution hub 500 and a plurality of wireless energy metering units of which one or more wireless energy metering unit will be located on Phase A circuits, one or more wireless energy metering units on Phase B circuits, and one or more wireless energy metering unit on phase C circuits. Over a common RF channel, the multi-phase wireless voltage distribution hub 500 will broadcast the three voltage reference phases (A,B,C) using a single multi-phase Tx voltage reference data frame encoding 526 provided by a processor where each phase reference voltage have been sampled by a common 32 times line rate clock. Active wireless energy metering units will lock onto the multi-phase Rx voltage reference data frame and extract the phase A, B, or C voltage samples depending on its configuration from higher layer management systems. The basic operation of the multi-phase wireless voltage distribution hub (FIG. 5) is similar to the single phase metering system shown in FIG. 3. In the multi-phase system, each voltage reference phase is digitally sampled and processed by A/D converters 512, 514, 516 using a common 32 times line rate clock derived from Phase_A zero crossing 520 and PLL 522. The three digitized reference voltage sample streams are multiplexed over a common multi-phase Tx voltage reference data frame and broadcast by the RF PHY 528 providing wireless interface to an antenna. Similar to the single phase practice (FIG. 3), the Tx Frame trigger timing is delay pay a determined transmission delay 524 determined to advance the Tx Frame to compensate for RF PHY transmission delays.

In alternate practice, Phase B or Phase C voltage reference could also be used for deriving the AC-cycle synchronized 32 times high-rate voltage sample clock. The 32 times AC-cycle voltage sampling clock is arbitrary, and other embodiments could use other multiple values of the AC-cycle line rate (e.g. 48, 64, 128, 256, etc). Other embodiments could make use of a free running high-rate (e.g. 32×, 64×, etc) voltage sample clock that is non-synchronized to either Phase A, B, or C voltage references. In other possible embodiments, each phase reference voltage in a multi-phase system could be assigned a separate RF channel to broadcast its voltage samples to all wireless energy metering units operating on the designated RF channel.

Figure 6:
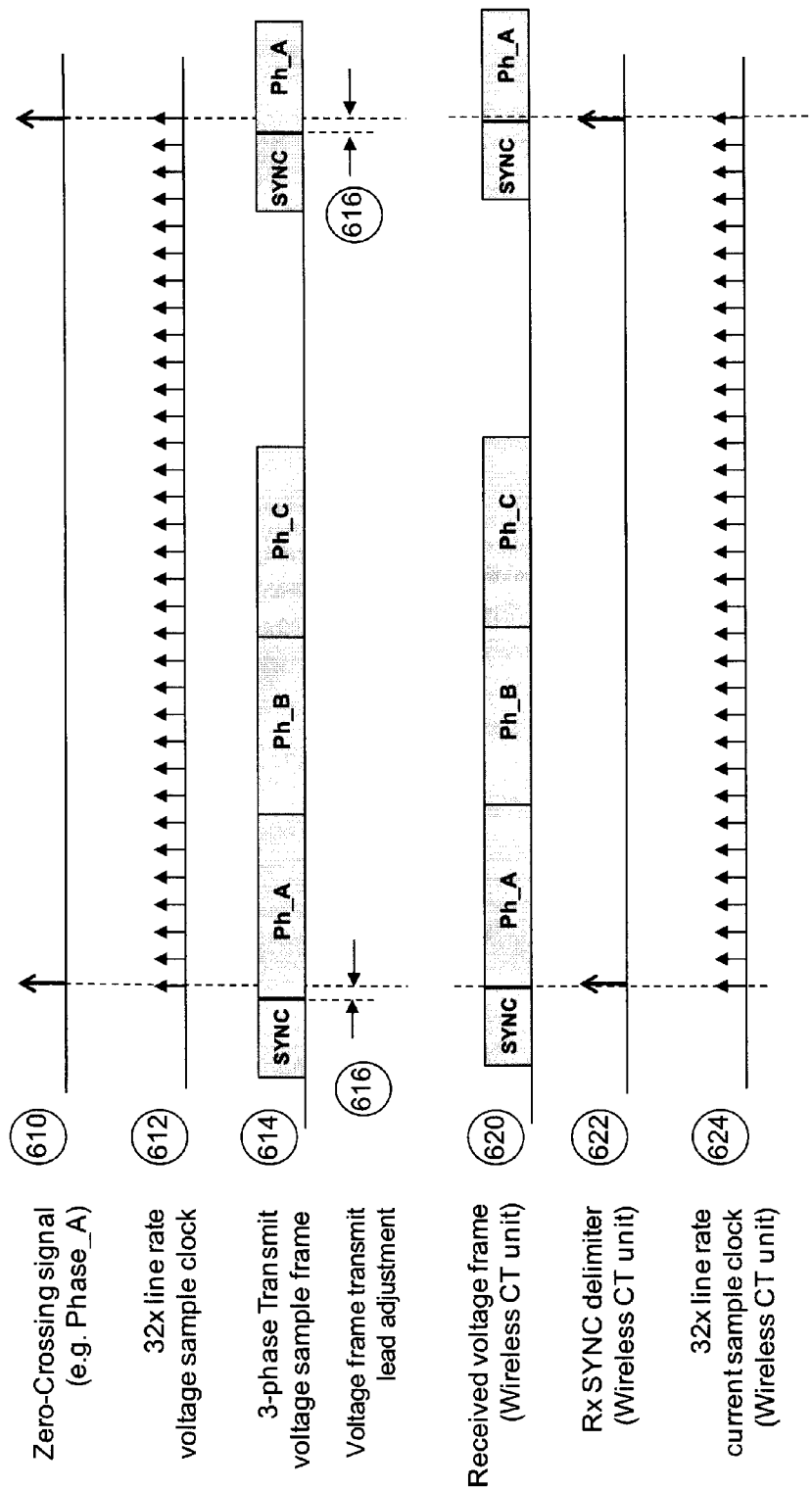
FIG. 6 shows a timing diagram of the voltage and current sampling alignment in a multi-phase wireless broadcast voltage reference distribution metering sub-system.

FIG. 6 shows the timing alignment of the multi-phase wireless voltage distribution metering system of FIG. 5. A common 32 times line rate voltage sample clock 612 is generated from the zero-crossing signal 610. The generated multi-phase Tx broadcast voltage reference data frame 614 is composed of 32 voltage samples from each of voltage references A, B, and C. Similar to the single phase system timing shown in FIG. 4, the Tx voltage reference data frame 614 has a small fixed lead 616 from the zero-crossing signal 610 in order to align the Rx current sample clock 624 to the Tx voltage sample clock 612. Alternatively individual Tx voltage RF frames for each AC voltage phase instead of the common multi-phase Tx voltage RF frame may be utilized.

Figure 7:
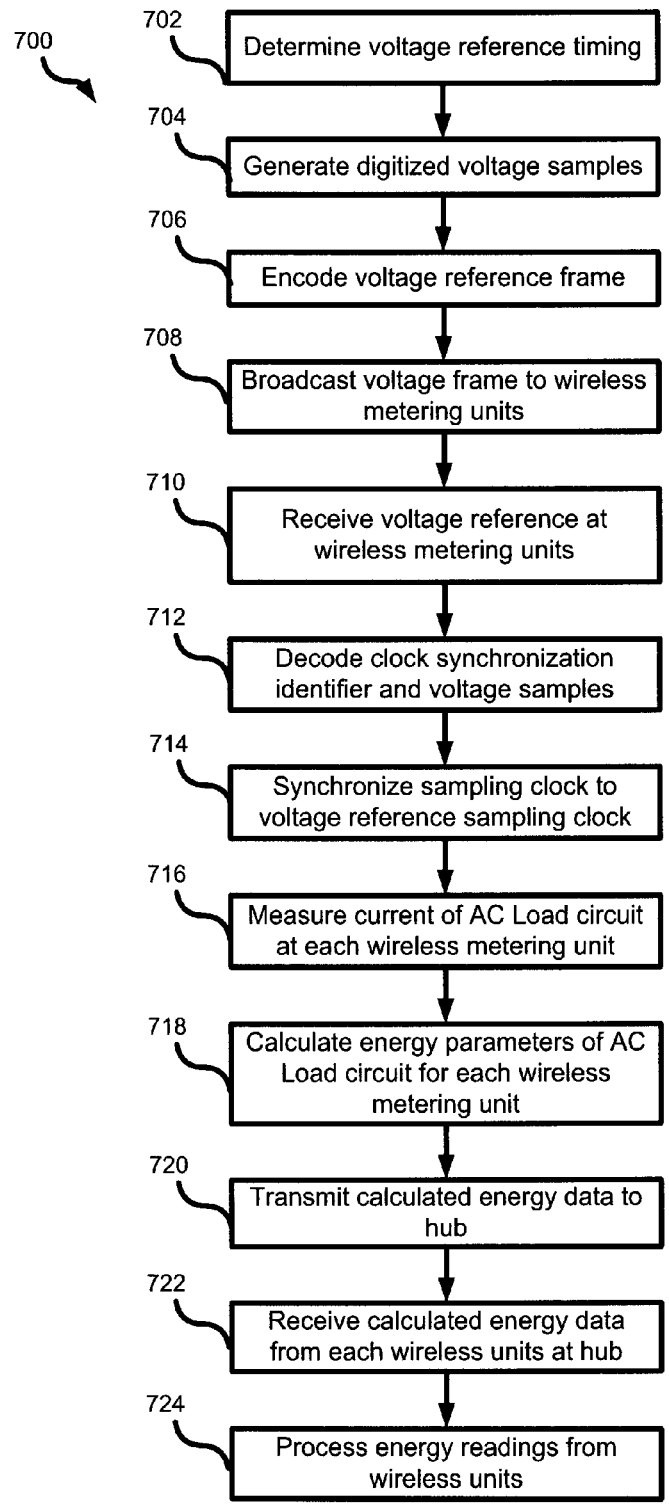
FIG. 7 shows a flowchart of a method of wireless voltage distribution in a wireless energy metering system.

FIG. 7 show a method 700 of wireless voltage distribution and energy metering in a wireless energy metering system. Based on the AC line rate, a voltage reference timing is determined by the wireless voltage distribution node (702). Voltage samples are digitized from the AC line (704) and a voltage reference data frame is generated by encoding the timing reference, such as for example as a SYNC identifier, and the one or more voltage samples are encoded in the payload of the voltage reference data frame (706). A single-phase sample or multi-phase samples may be provided in the voltage reference data frame depending on system configuration. The frame is then broadcasted, or transmitted, by a wireless interface to one or more wireless metering units (708) in relation to the AC cycle zero-crossing of the AC line voltage being measured. The transmission of the voltage reference data frame is adjusted to transmission, and/or propagation and reception delays between the wireless voltage distribution and data hub node and the wireless metering units. The wireless energy metering units receive the voltage reference data frame (710) and decode the timing reference and voltage samples (712) and align a sampling clock to the timing reference of the voltage reference sampling clock defined by the SYNC identifier (714). In a multi-phase configuration the wireless metering units uses the voltage sample associated with the particular phase being metered by the metering units. The AC load circuit associated with each wireless energy metering unit is measured to determine a current sample (716). Energy parameters can then be calculated for active, reactive and apparent power/energy from temporally aligned voltage and current samples (718). The calculated energy parameters are transmitted from each wireless energy metering unit (720) to the hub. The hub receives the transmission from each wireless energy metering unit and decodes the energy parameters (722). The energy parameters are then processed and stored (724). The voltage reference data frame may also include a polling address or wireless energy metering unit identifier address where each wireless metering unit is provided with a unique address, the polling address notifying wireless metering units when they should transmit their determined energy data. The wireless energy metering units may transmit the energy parameters periodically or may only transmit energy parameters when specifically identified by a request from the hub for example in as identified in a polling address transmitted with the voltage reference.

Figure 8:
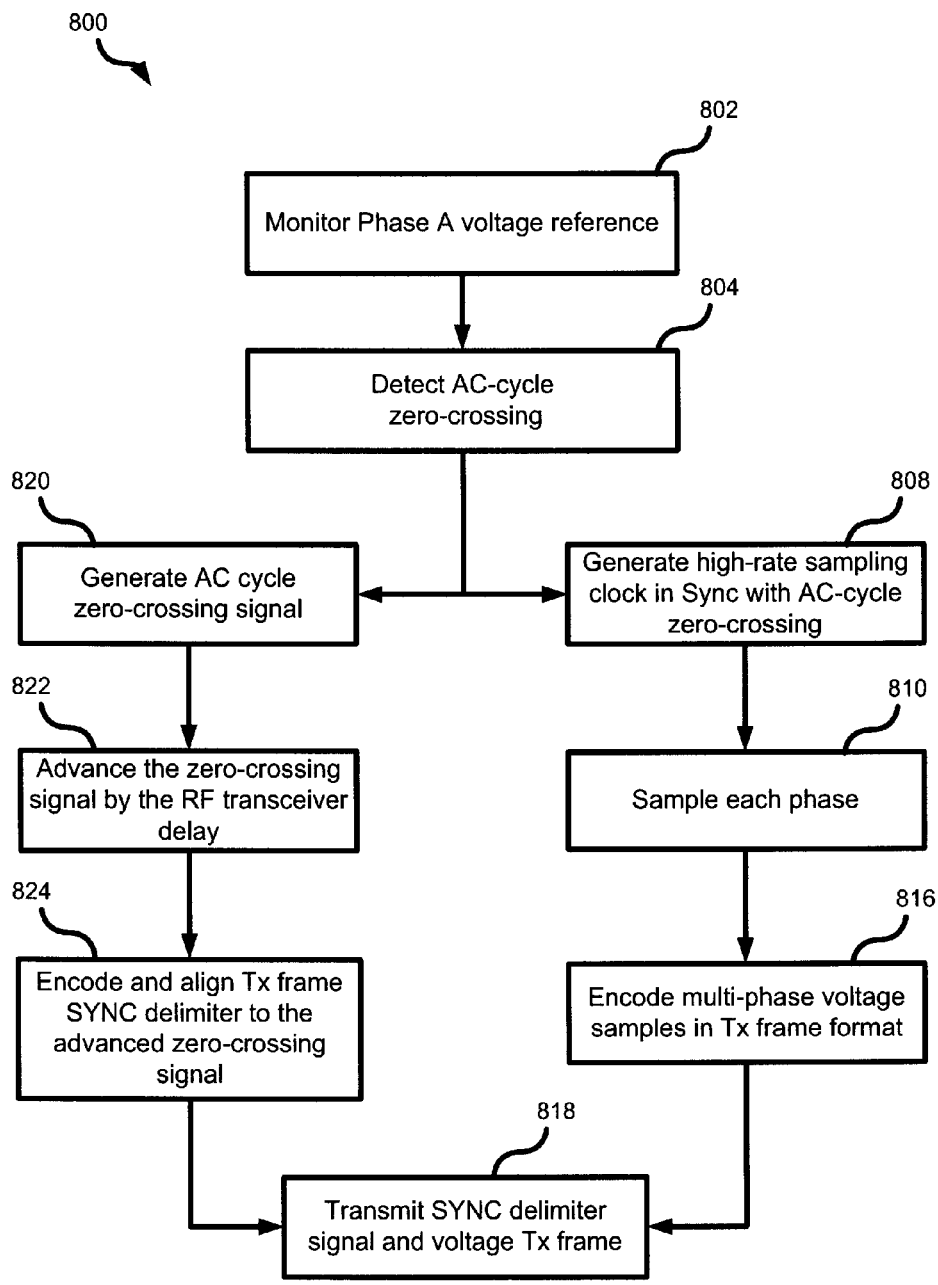
FIG. 8 shows a flowchart of a method for wireless voltage reference distribution transmission in a multi-phase AC energy metering system.

FIG. 8 shows the voltage reference wireless broadcast distribution transmit method 800 for a multi-phase AC metering system. In one embodiment, the process begins by monitoring the Phase A voltage reference (802) to detect a zero-crossing event (804). When a zero-crossing event is detected once per AC-cycle, a clock signal is generated (820) in sync and phase with the phase_A voltage reference. The AC-cycle zero-crossing signal is employed to generate a synchronized 32 times clock signal (808) for sampling the three voltage references (810). The 32 voltage samples from each phase are encoded into a packet frame (816) ready for RF broadcast distribution (818). Based on off-line measurements the Tx voltage reference data frame trigger signal (824) is set to lead the AC-cycle clock by the RF transceiver transmission delays (822) for triggering the SYNC delimiter transmission (818). It should be noted that in a single-phase distribution system only 1-phase voltage (810) would be sampled and would be encoded in the Tx frame format (816). It should be noted that the voltage clock reference may not be synchronized to the zero-crossing signal but may alternatively be free-running relative to the AC line cycle.

Figure 9:
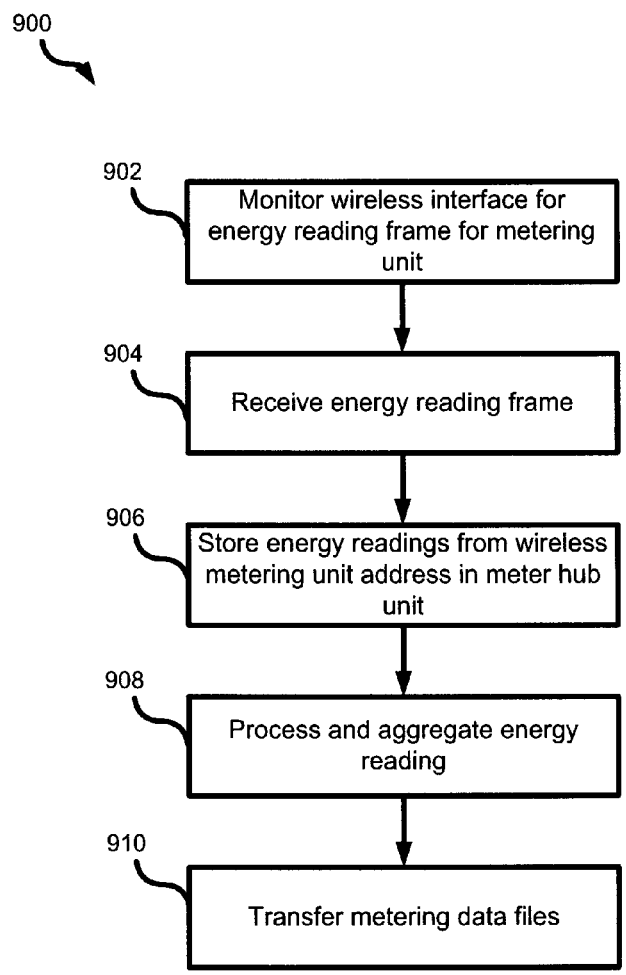
FIG. 9 show a flowchart of a method for receiving energy measurements from wireless energy metering units.

FIG. 9 provides a method 900 for energy parameter readings transfer from a wireless energy metering unit to the hub node. As part of the broadcast voltage reference data frame over the wireless technology, a next CT metering unit address is included to request energy readings from a particular wireless energy metering unit. The wireless interface is monitored (902) for received energy readings frame and upon reception (904) the energy data is stored (906) along with CT metering unit address. The energy readings data from one or more CT metering units is processed and aggregated (908) in a format suitable for file transfer (910) and viewing.

Figure 10:
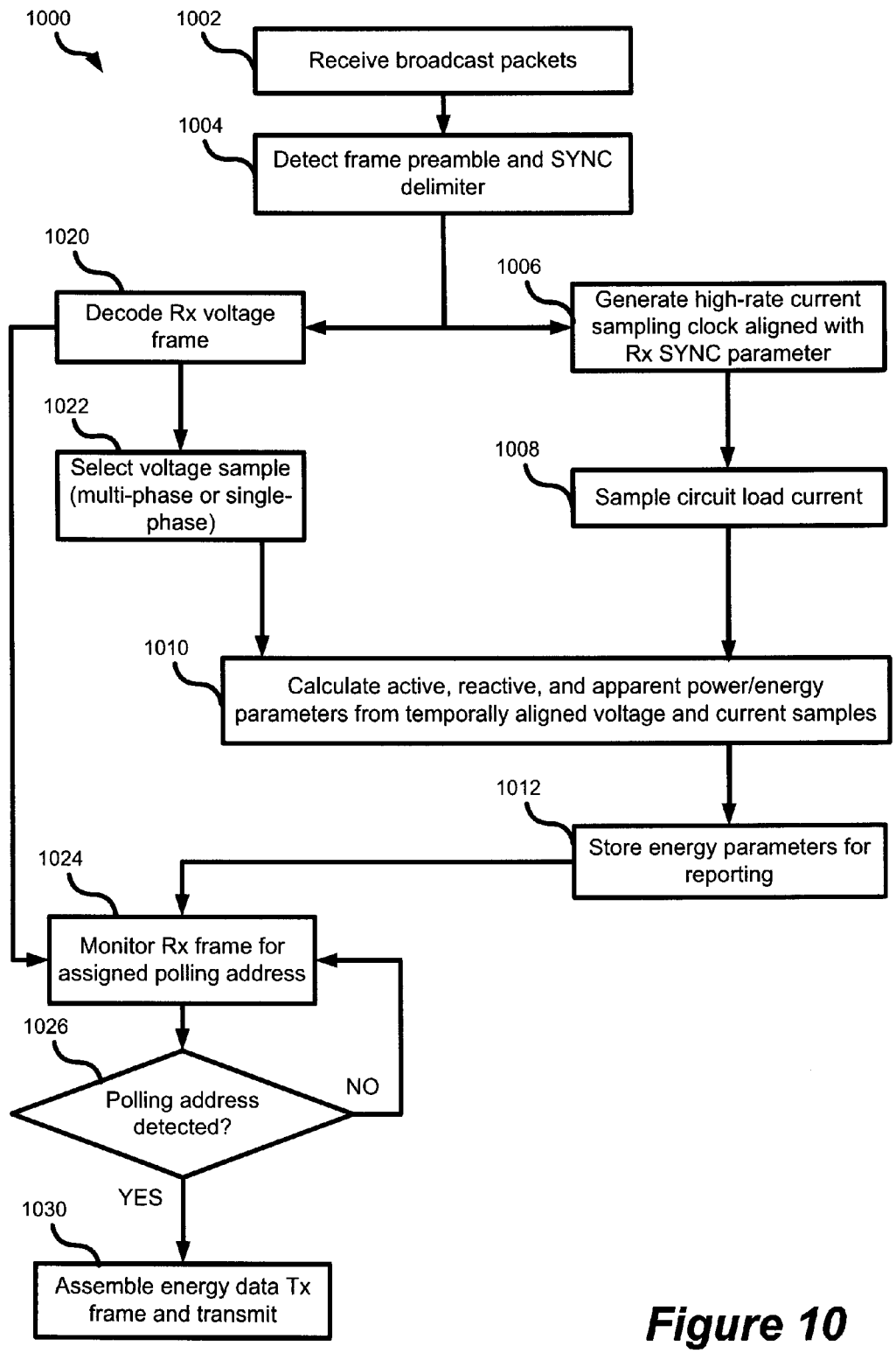
FIG. 10 shows a flowchart of a method for received wireless voltage reference distribution for a multi-phase AC energy metering system.

FIG. 10 shows the voltage reference wireless broadcast distribution receive method 1000 for a multi-phase AC metering system. The RF medium/channel is monitored (1002) for received voltage reference broadcast packets. When a voltage broadcast preamble and SYNC delimiter is detected (1004) at regular intervals once per AC-cycle (e.g. 60 Hz), the received broadcast multi-phase voltage reference data frame, is decoded (1020) and one of the phase voltage samples (A, B, or C) is selected (1022) for power/energy calculation (1010) based on control from higher layer management system. If a single-phase voltage sampling is utilized by the distribution hub, the single phase will be utilized. The detected frame SYNC delimiter byte is aligned with the remote voltage reference sampling clock and is employed to generate a local synchronized 32 times clock (1006) for sampling the CT load circuit current (1008) in temporal alignment with the remote transmit voltage sampling. The resulting load current are utilized for active, reactive, and apparent energy/power calculations (1010) in conjunction with the temporally aligned voltage samples and stored as energy parameters in local memory for reporting (1012). The Rx voltage reference data frame is monitored (1024) for a polling address that matches a polling address assigned to the wireless energy metering unit (1024). When the associated polling address is detected (YES at 1026) an assembled Tx energy data frame is transmitted wirelessly to the distribution hub (1030). If the polling address is not received (NO at 1026), the energy parameters are stored and assembled for the next polling address to be received.

Figure 11:
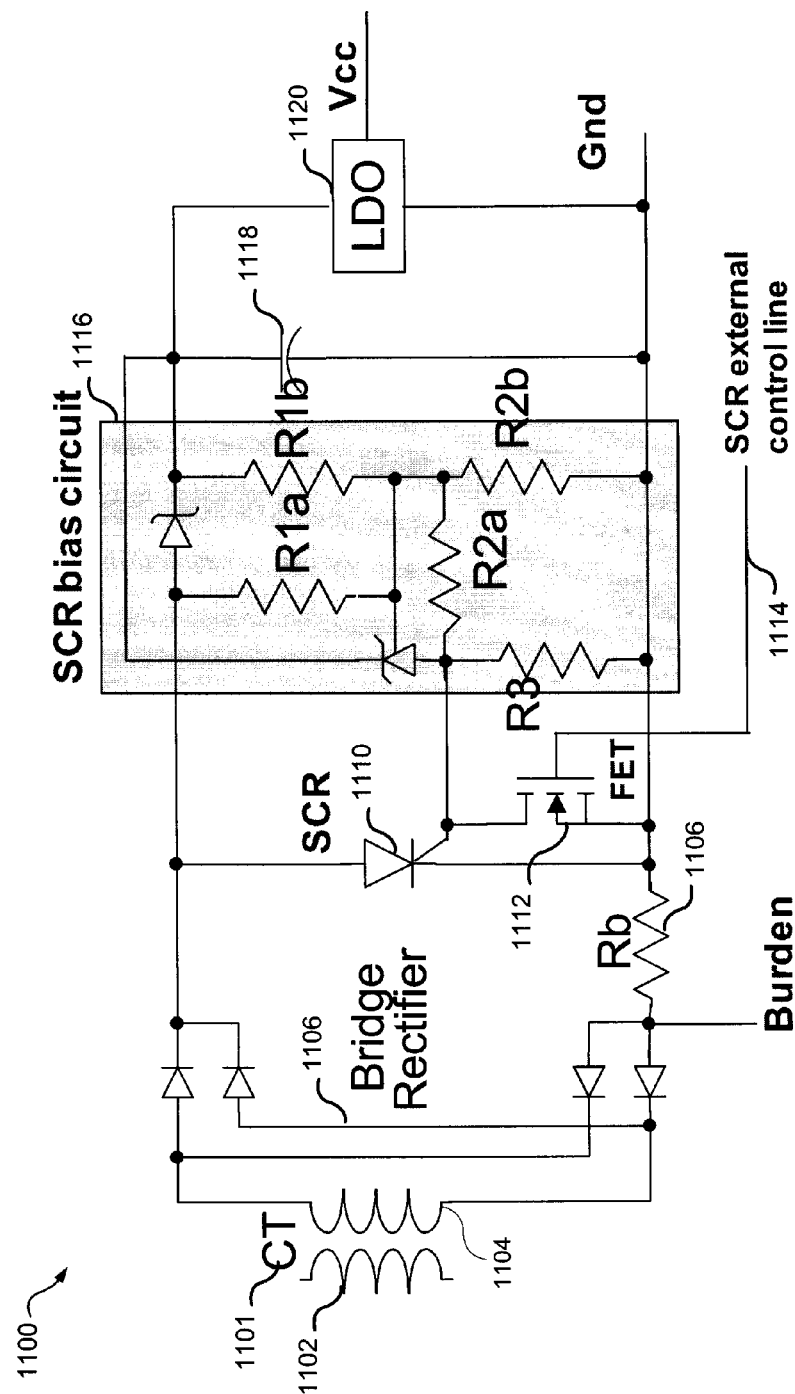
FIG. 11 shows a schematic of an inductive power supply operating from the CT's secondary winding.

FIG. 11 shows an embodiment of an inductive power supply 1100 operating from the CT's (1101 secondary winding 1104 of a wireless metering unit. The primary winding 1102 of the CT 1101 is the circuit under current sensing. The CT's secondary voltage is full-wave rectified 1106 and applied to an output charging capacitor 1118. A low drop-out regulator 1120 generates the regulated voltage required by the control electronics of the wireless energy metering unit. To minimize power and heat dissipation, the inductive power supply makes use of a silicon-controlled rectifier (SCR) circuit 1110 to clamp-down the secondary voltage when it gets much above the required output voltage. The SCR 1110 is controlled by feedback from the output charging capacitor voltage 1118 via SCR bias circuit 1116. To improve stability at low currents, a field-effect transistor (FET) circuit 1112 is provided to shut-off the SCR 1110 via external control 1114. For current sensing, a burden resistor 1108 is located in series with the inductive power supply and inside the bridge rectifier 1106. Power from the inductive power supply is provided to components of the wireless metering unit removing the requirement for a battery component to power the wireless metering unit.

In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Although the description discloses example methods, system and apparatus including, among other components, software executed on hardware, it should be noted that such methods and apparatus are merely illustrative and should not be considered as limiting. For example, it is contemplated that any or all of these hardware and software components could be embodied exclusively in hardware, exclusively in software, exclusively in firmware, or in any combination of hardware, software, and/or firmware. Accordingly, while the following describes example methods and apparatus, persons having ordinary skill in the art will readily appreciate that the examples provided are not the only way to implement such methods and apparatus.

In some embodiments, any suitable computer readable media or memory can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

The invention claimed is:

1. A method of wireless distributed energy metering, the method comprising:
   determining a voltage reference sampling clock at a distribution hub;
   generating one or more digitized voltage samples from an alternating current (AC) line under measurement coupled to the AC line by a voltage sensing device;
   encoding a voltage reference data frame comprising the one or more digitized voltage samples; and
   broadcasting the voltage reference data frame over radio frequencies (RF) to one or more wireless metering units each coupled to an AC load circuit of the AC line where a current sample clock of each of the wireless energy metering units is synchronized to the voltage reference sampling clock of the distribution hub, and the one or more voltage samples from the distribution hub and one or more current samples obtained by one or more current sensing devices at the one or more wireless metering units are utilized in calculating energy parameters sampled by the wireless energy metering units from the respective AC load circuit.

2. The method of claim 1 wherein the voltage reference sampling clock is a high-rate free-running clock which is non-synchronized to an AC-line rate.

3. The method of claim 1 wherein the voltage reference sampling clock is a high-rate clock synchronized to a zero-crossing of the AC line.

4. The method of claim 1 wherein the broadcast voltage reference data frame further comprises a clock synchronization identifier in direct relation to the voltage reference sampling clock.

5. The method of claim 4 wherein the each of the one or more wireless metering units uses the clock synchronization identifier to synchronize the current sample clock to the voltage reference sampling clock of the distribution hub.

6. The method of claim 1 wherein the voltage reference data frame is broadcast slightly ahead of the voltage reference sampling clock based upon a set transmission delays proportional to transceiver processing delay between the distribution hub and the one or more wireless metering units.

7. The method of claim 1 wherein determining the one or more voltage samples further comprises determining a respective voltage sample for each phase of a multi-phase AC circuit and encoding the voltage reference data frame comprises encoding each respective voltage samples for each of the phases in the voltage reference data frame.

8. The method of claim 1 wherein the energy parameters comprises one or more of active, reactive and apparent power/energy parameters.

9. A system for wireless distributed energy metering comprising:
   a distribution hub for wirelessly broadcasting voltage reference data frames providing voltage samples from an alternating current (AC) line as measured by a voltage sensing device at the distribution hub, and
   one or more wireless metering units each coupled to an AC load circuit for receiving the broadcast voltage reference data frames wherein a current sampling clock of each of the one or more wireless metering units is synchronized to a voltage reference sampling clock of the distribution hub for determining current samples from the respective AC load circuit as measured by one or more current sensing devices at the one or more wireless metering units to calculate energy data parameters.

10. The system of claim 9 wherein the voltage reference sampling clock is a high-rate free-running clock which is non-synchronized to an AC-line rate.

11. The system of claim 9 wherein the voltage reference sampling clock is a high-rate clock synchronized to a zero-crossing of the AC line.

12. The system of claim 9 wherein the broadcast voltage reference data frame further comprises a clock synchronization identifier in direct relation to the voltage reference sampling clock.

13. The system of claim 12 wherein the each of the one or more wireless metering units uses the clock synchronization identifier to synchronize a current sample clock to the voltage reference sampling clock of the distribution hub.

14. The system of claim 9 wherein the voltage reference data frame is broadcast slightly ahead of the voltage reference sampling clock based upon a set transmission delays proportional to transceiver processing delay between the distribution hub and the one or more wireless metering units.

15. The system of claim 9 wherein the voltage samples are determined for each phase of a multi-phase AC circuit and data frame is encoded for each respective voltage samples for each of the phases in the reference data frame.

16. The system of claim 9 wherein each of the one or more wireless metering units further comprising an inductive power supply coupled to a current sensing device for harvesting operating power from the AC line under measurement to power the wireless metering unit.

17. A wireless energy metering unit comprising:
a current sensing device coupled to a load circuit of an alternating current (AC) line under measurement;
a wireless interface; and
a processor for:
receiving a broadcast voltage reference data frame through the wireless interface from a distribution hub;
decoding one or more voltage samples from the broadcast voltage reference data frame that were obtained using a voltage sensing device at the distribution hub;
synchronizing a current sampling clock of the wireless metering unit based upon the broadcast voltage reference data frame; and
determining a current sample from the current sensing device, wherein a current sampling clock of the wireless energy metering unit is synchronized to voltage sampling clock of the distribution hub.

18. The wireless energy metering unit of claim 17 further comprising a phase-lock-loop (PLL) for receiving a synchronization identifier from the broadcast voltage reference data frame to generating the current sampling clock.

19. The wireless energy metering unit of claim 17 further comprising an analog-to-digital converter for receiving an analog current sample from the current sensing device and converting it to a digital current sample in synchronization with the sampling clock.

20. The wireless energy metering unit of claim 17 wherein the processor further calculates energy parameters using one or more voltage samples and one or more current samples, the energy parameters comprising one or more of active, reactive and apparent power/energy parameters.

21. The wireless energy metering unit of claim 17 wherein the current sensing device is one of: a current transformer (CT), a Rogowski coil, a shunt, a hall effect sensor; or a Micro-Electro-Mechanical Systems (MEM) based sensor.

22. The wireless energy metering unit of claim 17 further comprising an inductive power supply coupled to the current sensing device for harvesting operating power from the AC line under measurement to power the wireless energy metering unit.

* * * * *